US012693332B2

(12) United States Patent (10) Patent No.: US 12,693,332 B2
Chiu et al. (45) Date of Patent: Jul. 28, 2026

(54) HANDLER WITH COOLING HEAD AND DOUBLE-SIDED FIN STRUCTURE

(71) Applicant: Taiwan Semiconductor Manufacturing Co., Ltd., Hsinchu (TW)

(72) Inventors: Ting-Yu Chiu, Hsinchu (TW); Yi-Neng Chang, Hsinchu (TW); Shin-Han You, Hsinchu (TW); Chien Fang Huang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 161 days.

(21) Appl. No.: 18/737,457

(22) Filed: Jun. 7, 2024

(65) Prior Publication Data

US 2025/0377406 A1 Dec. 11, 2025

(51) Int. Cl.
G01R 31/28 (2006.01)

(52) U.S. Cl.
CPC ..... G01R 31/2891 (2013.01); G01R 31/2889 (2013.01)

(58) Field of Classification Search
CPC ........................ G01R 31/2891; G01R 31/2889
See application file for complete search history.

(56) References Cited

U.S. PATENT DOCUMENTS

| | | | | |
|---|---|---|---|---|
| 11,990,404 | B2 * | 5/2024 | Tsai ..................... | H01L 21/6835 |
| 12,300,575 | B2 * | 5/2025 | Yu ....................... | H01L 23/3677 |
| 2009/0179657 | A1 * | 7/2009 | Williamson ....... | G01R 31/2889 |
| | | | | 324/754.08 |

* cited by examiner

*Primary Examiner* — Reena Aurora

(74) *Attorney, Agent, or Firm* — Seed IP Law Group

(57) ABSTRACT

A final test (FT) handler including a fin structure. The fin structure includes a first side and a second side opposite to the first side. A plurality of protrusions of the fin structure are at the first side and are defined or delimited by a plurality of recesses that extend into the first side of the fin structures. The plurality of protrusions are inserted into a TIM layer of the FT handler and the plurality of recesses are filled by the TIM layer. The plurality of protrusion and plurality of recesses increase a contact area between the TIM layer and the fin structure. The FT handler is configured to, in operation, pick up, hold onto, and transport one or more semiconductor devices to be tested, for example, with a high-performance computing (HPC) test for quality assurance and control purposes.

20 Claims, 6 Drawing Sheets

HANDLER WITH COOLING HEAD AND DOUBLE-SIDED FIN STRUCTURE

BACKGROUND

Semiconductor dice or semiconductor packages are manufactured by utilizing various manufacturing steps, techniques, processes, and methods. After the semiconductor dice and semiconductor packages are manufactured, the semiconductor dice or packages are tested for quality control purposes such that the semiconductor dice or packages are functioning within selected tolerances. For example, in at least one situation, one or more final tests are conducted on a selected number or all of the semiconductor dice or packages that are manufactured, for example, to test the electrical pathways and connections within and throughout the semiconductor dice or packages. If the semiconductor dice or packages are determined to function within the selected tolerances by performing the final test, the semiconductor dice or packages are determined to be of sufficient quality and provided to a customer. Alternatively, if the semiconductor dice or packages are determined to function outside of selected tolerances by performing the final test, the semiconductor dice or packages are determined to be of insufficient quality and are generally disposed of or thrown out.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figures 1, 2:
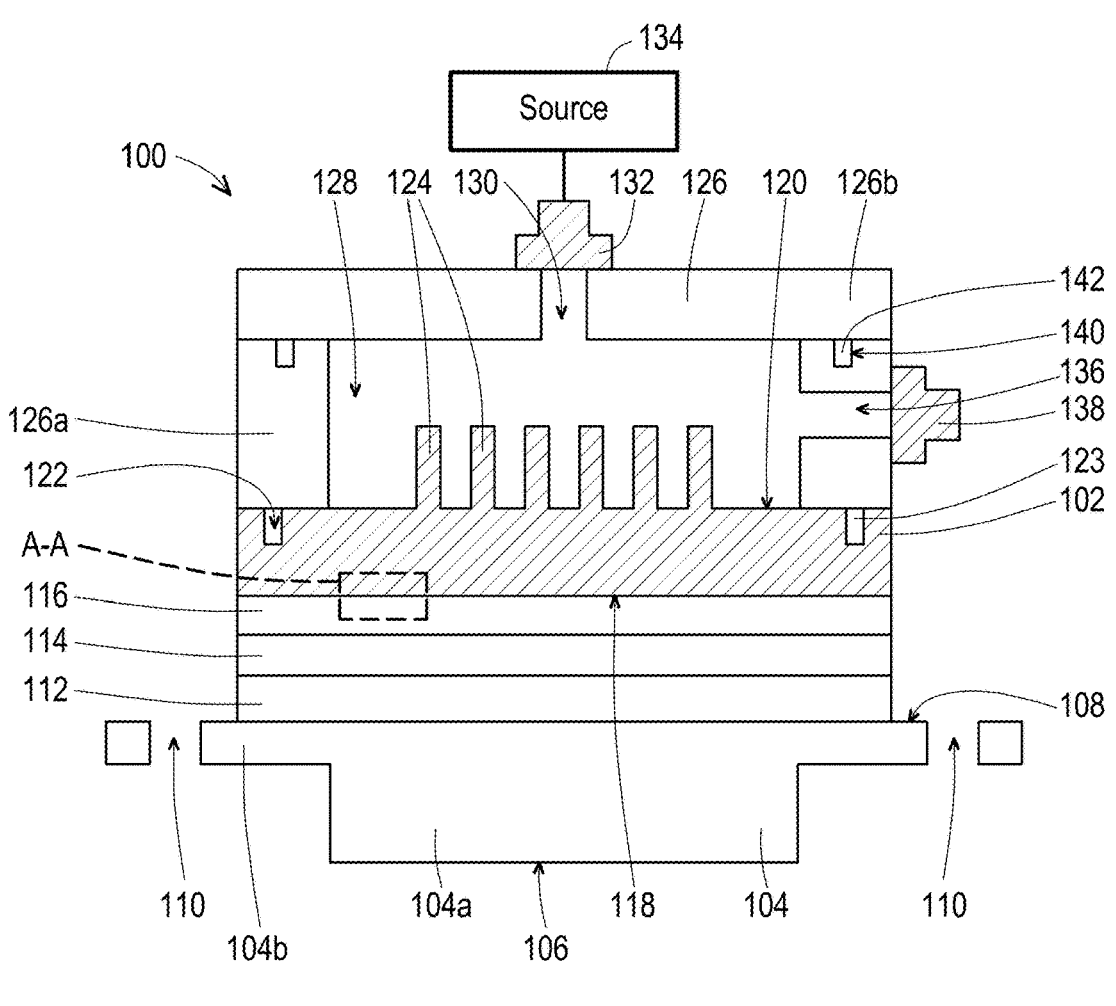
FIG. 1 is a cross-sectional side view of a final test (FT) handler.
FIG. 2 is a cross-sectional side view of a fin structure that can be utilized within the FT handler as shown in FIG. 1.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to one or more embodiments of an FT handler including a fin structure that at least partially delimits a coolant chamber to maintain a temperature of the FT handler when performing a high performance computing (HPC) test on one or more semiconductor dice or packages that have been manufactured and are to be provided or sold to a customer. One or more embodiments of the fin structure can be utilized and present within one or more embodiments of the FT handler of the present disclosure. For example, in at least one embodiment of the fin structure, the fin structure includes a first side at which a plurality of fins are present and inserted into a thermal interface material (TIM). The fin structure further includes a plurality of pillars present at a second side opposite to the first side and the plurality of pillars are present within a coolant chamber. A plurality of recesses are defined and delimited between the plurality of fins at the first side of the fin structure and are filled by the TIM. The recesses and the plurality of fins being present at the first side reduces a likelihood of or prevents mechanical defects such as air gaps being present between an interface of the TIM and the first side of the fin structure. Reducing the likelihood of or preventing these air gaps from being present at the interface between the TIM and the first side of the fin structure improves power efficiency of controlling the temperature of the FT handler when performing the HPC tests on the one or more semiconductor dice or packages. Improving the power efficiency of controlling the temperature of the FT handler when performing the HPC tests reduces costs of performing these tests. Also, the fin structure having the plurality of fins inserted into the TIM improves overall performance for more accurately and precisely controlling the temperature of the FT handler when in use to perform the HPC tests reducing a likelihood of or preventing mechanical defects (e.g., cracking, warpage, etc.)

from occurring within the semiconductor dice or packages being tested utilizing the FT handler.

FIG. 1 is a cross-sectional side view of a final test (FT) handler 100 including a fin structure 102. FIG. 2 is a cross-sectional side view of the fin structure 102 as present within the FT handler 100. An end effector 104 of the FT handler 100 includes a first side 106 and a second side 108 opposite to the first side 106. The end effector 104 further includes a first portion 104a and a second portion 104b. The first portion 104a is an end effector portion that engages or cooperates with at least one semiconductor die or package (not shown) such that the at least one semiconductor die or package is present and is held in place at the first side 106 of the end effector 104. The second portion 104b is a guide portion including one or more guide holes 110 that pass through the second portion 104b. The one or more guide holes 110 are present at a left and right hand side of the end effector 104 as shown in FIG. 1. The second portion 104b extends around the first portion 104a and is less thick than the first portion 104a. The guide holes 110 are configured to, in operation, receive one or more guide pins such that the FT handler is positioned appropriately when performing a high performance computing (HPC) test on the one or more semiconductor dice or packages held in place at the first side 106 of the end effector 104.

Figure 9:
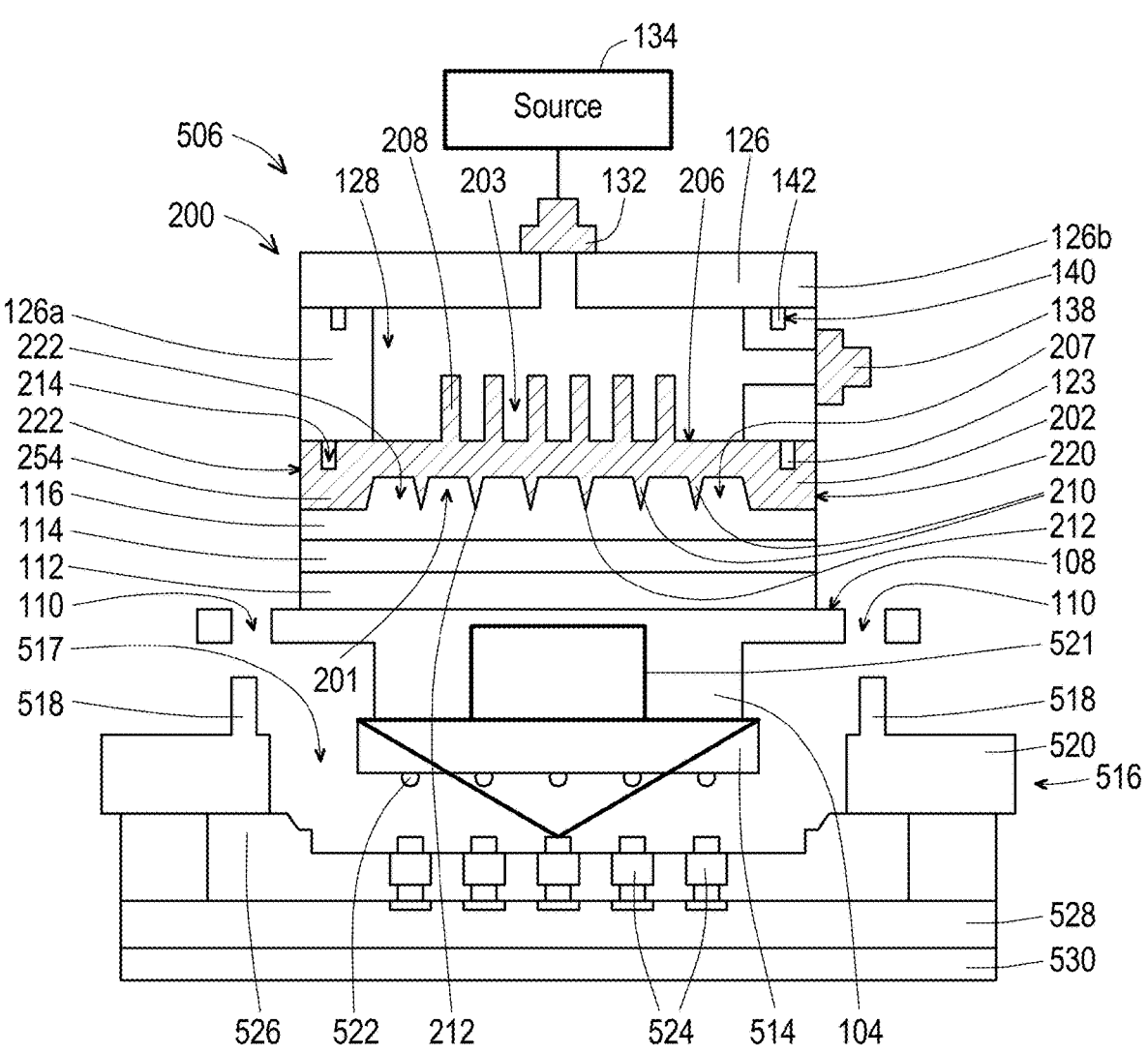
FIG. 9 is a cross-sectional side view of a respective step of the method of testing the one or more semiconductor dice or packages as shown in FIG. 8 utilizing the FT handler as shown in FIG. 4, in accordance with some embodiments.

In some embodiments of the FT handler 200, the end effector 104 is a vacuum end effector 104 that generates a vacuum to pick up and hold onto one or more semiconductor devices (e.g., see semiconductor device 514 as shown in FIG. 9). In some other embodiments of the FT handler 200, the end effector 104 may be a clamp or some other type of mechanical end effector that is configured to, in operation, pick up and hold onto one or more semiconductor devices.

A first thermal interface material (TIM) layer 112 is present on the second side 108 of the end effector. The first TIM layer 112 is made of a thermally conductive material to transfer thermal energy to and from the end effector 104 to control a temperature of the end effector 104 and the FT handler 100, as well as control a temperature of the one or more semiconductor dice or packages when held in place at the first side 106 of the end effector 104. The first TIM layer 112 has a thermal conductivity greater than or equal to 2 W/(m·K) (Watts/(meters*Kelvin)) or less than or equal to 200 W/(m·K) (Watts/(meters*Kelvin)).

A heater pad 114 is on the first TIM layer 112 and is spaced apart from the second side 108 of the end effector 104 by the first TIM layer 112. The heater pad 114 is in electrical communication with an energy or power source that is configured to, in operation, provide energy or power to the heater pad 114 to increase the temperature of the heater pad 114 and, as a result, increase the temperature of the FT handler 100. For example, the heater pad 114 is present to control a temperature of the FT handler 100 when in use.

A second thermal interface material (TIM) layer 116 is on the heater pad 114 and is spaced apart from the first TIM layer 112 by the heater pad 114. The second TIM layer 116 may be made of the same or similar material as the first TIM layer 112. The second TIM layer 116 has a thermal conductivity greater than or equal to 2 W/(m·K) (Watts/(meters*Kelvin)) or less than or equal to 200 W/(m·K) (Watts/(meters*Kelvin)).

The fin structure 102 includes a first side or surface 118 and a second side or surface 120 opposite to the first side or surface 118. The first surface 118 is a substantially flat or level surface that is coupled to the second TIM layer 116. A location at which the first surface 118 of the fin structure 102 and the second TIM layer 116 are coupled together may be referred to as a TIM and fin structure interface. The fin structure 102 further includes a recess 122 that is structured to receive a first seal structure or component 123, for example, an O-ring. The fin structure 102 further includes a plurality of pillars 124 that extend outward from the second surface 120 of the fin structure 102. The plurality of pillars 124 is spaced inward from the recess 122 that receives the first seal structure 123.

A container 126 is stacked on and coupled to the fin structure 102. As shown in FIG. 1, the container 126 is coupled to the second surface 120 of the fin structure 102. The container 126 includes a lateral wall structure or portion 126a and a cover structure or portion 126b. The cover structure 126b is stacked on and coupled to the lateral wall structure 126a. The lateral wall structure 126a and the cover structure 126b of the container 126 along with the fin structure 102 delimit and define a chamber 128. The plurality of pillars 124 of the fin structure 102 extends into and is present within the chamber 128. The plurality of pillars 124 is present to dissipate heat from the FT handler 100 to control a temperature of the FT handler 100 when in use. An inlet opening 130 extends through the cover structure 126b and is in fluid communication with the chamber 128.

An inlet structure 132 is in fluid communication with the inlet opening 130. The inlet structure 132 is in fluid communication with a fluid source 134, and the fluid source 134 contains a fluid, which may be a liquid, a gas, a semi-liquid, or a semi-gas, that is readily introduced into the chamber 128 by passing through the inlet structure 132 and the inlet opening 130 into the chamber 128. For example, the fluid that is introduced into the chamber 128 through the inlet structure 132 and the inlet opening 130 may be a coolant. In at least one situation, the inlet structure 132 is a valve that is configured to, in operation, control an amount of the fluid from the source 134 that is introduced into the chamber 128 of the container 126 through the inlet structure 132 and the inlet opening 130.

An outlet opening 136 extends through the lateral wall structure 126a of the lateral container 126. The fluid that is present within the chamber 128 of the container 126 exits the chamber 128 by passing through the outlet opening 136 and the outlet structure 138. In at least one situation, the outlet structure 138 is a valve that it configured to, in operation, control an amount of the fluid that exits the chamber 128 of the container 126 through the outlet opening 136 and the outlet structure 138.

A recess 140 is within the lateral wall structure 126a at an end of the lateral wall structure 126a at an interface between the lateral wall structure 126a and the cover structure 126b at which the lateral wall structure 126a and the cover structure 126b are coupled. The recess 140 is similar to the recess 122 in that the recess 140 receives a second seal structure or component 142. The second seal structure 142 is similar to the first seal structure 124 as the second seal structure 142 may be, for example, an O-ring.

The first seal structure 123 seals a lower end of the chamber 128 at an interface between the second surface 120 of the fin structure 102 and the lateral wall structure 126a of the container 126. The second seal structure 142 seals an upper end of the chamber 128 at the interface between the lateral wall structure 126a and the cover portion 126b of the container 126. The sealing of the lower end and the upper end of the chamber 128 of the container 126 prevents fluid (e.g., coolant) from leaking out of the chamber 128 of the container 126 when the fluid from the source 134 is introduced into the chamber 128 of the container 126.

Furthermore, as can be seen in FIG. 1, respective sidewalls of the first TIM layer 112, the heater pad 114, the second TIM layer 116, the fin structure 102, the lateral wall structure 126a of the container 126, and the cover 126b of the container 126 are substantially coplanar and flush with each other. The respective sidewalls of the TIM layer 112, the heater pad 114, the second TIM layer 116, the fin structure 102, the lateral wall structure 126a of the container 126, and the cover 126b of the container 126 are spaced inward from the one or more guide holes 110 that pass through the second portion 104b of the end effector 104.

Figure 3:
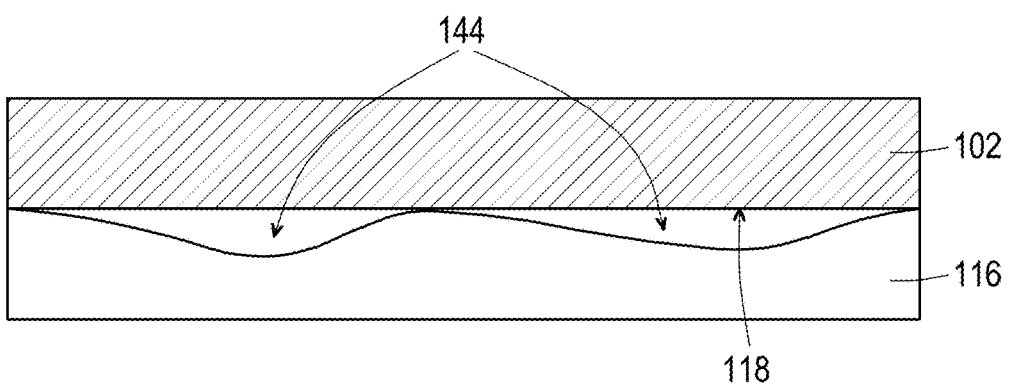
FIG. 3 is a zoomed in, enhanced view of section A-A of the FT handler as shown in FIG. 1.

FIG. 3 is a zoomed in, enhanced view of section A-A of the FT handler 100 as shown in FIG. 1 at which the fin structure 102 is stacked on and coupled to the second TIM layer 116. As shown in FIG. 3, the first surface 118, which is substantially flat or level, of the fin structure 102 is stacked on and coupled to the second TIM layer 116. At the interface between the first surface 118 of the fin structure 102 and the second TIM layer 116 includes one or more gaps or cavities 144. The gaps 144, which are air gaps or cavities, are formed when coupling the fin structure 102 to the second TIM layer 116, or the gaps 144 are formed as the FT handler 100 is exposed to increases and decreases in temperature when testing one or more semiconductor packages utilizing the FT handler 100 during a testing process, which may be an HPC test. The presence of the gaps 144 at the interface between the first surface 118 of the fin structure 102 and the second TIM layer 116 results in decreased or limited efficiency in controlling the temperature of the FT handler 100 (e.g., increasing or decreasing a respective temperature of FT handler 100 by utilizing the heater pad 114 and by introducing the fluid from the source 134 into and through the chamber 128). For example, the presence of the one or more gaps 144 allows for air to be present between the first surface 118 of the fin structure 102 and results in controlling the temperature of the FT handler 100 to be less accurate. This decreased accuracy in controlling the temperature of the FT handler 100 may result in damaging packages (e.g., warpage, cracking, or other similar or like mechanical defects) being held onto by the end effector 104 when being tested utilizing the FT handler 100 during a testing process, which may be an HPC test. In view of this discussion of the decreased efficiency and decreased accuracy in temperature control of the FT handler due to the presence of the one or more gaps 144, the following discussion will discuss one or more embodiments of a fin structure to reduce the likelihood or prevent formation of the one or more gaps 144.

Figure 4:
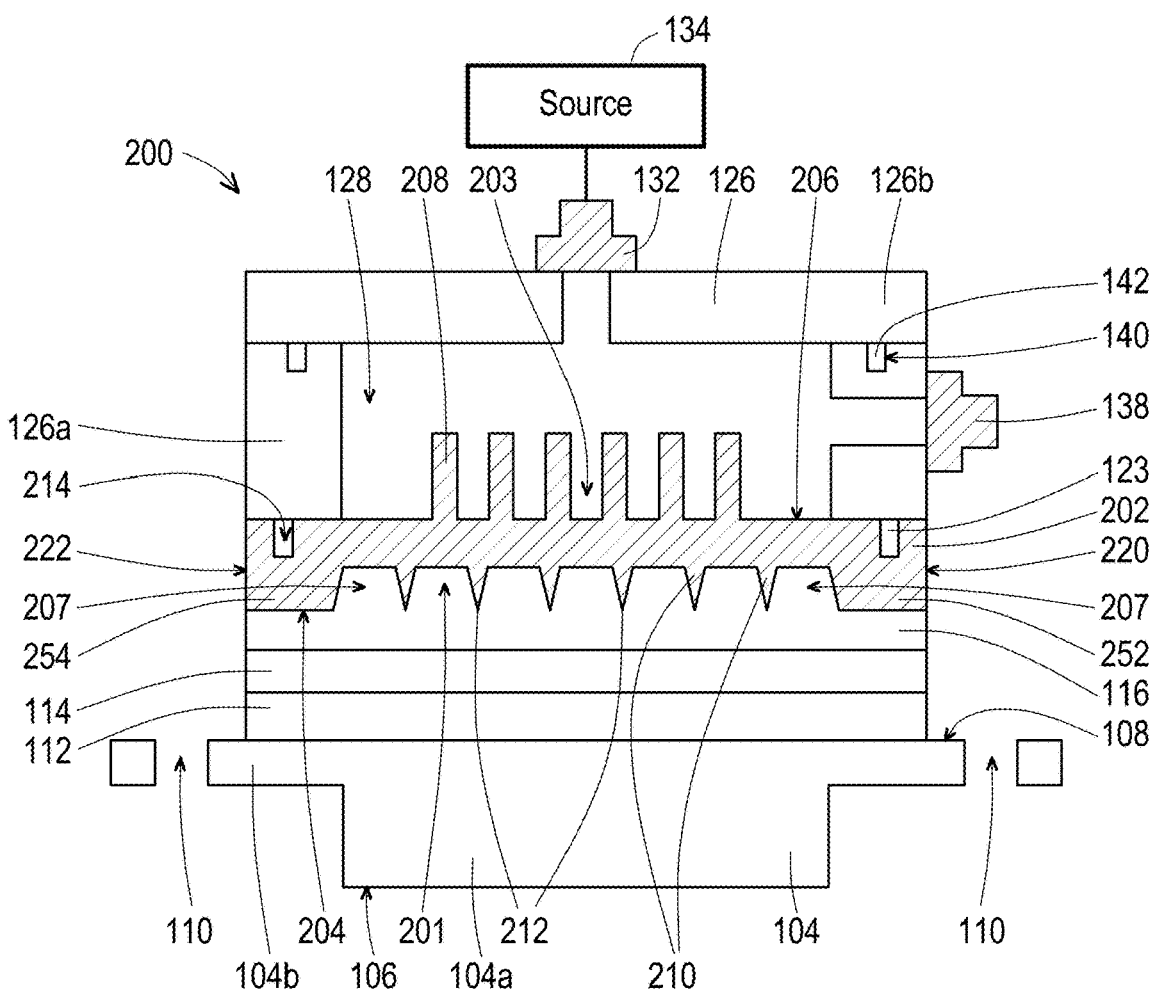
FIG. 4 is a cross-sectional side view of a final test (FT) handler, in accordance with some embodiments.

FIG. 4 is a cross-sectional view of a final test (FT) handler 200, in accordance with some embodiments. The FT handler 200 includes a fin structure 202 having a first side 201 and a second side 203 opposite to the first side 201. The FT handler 200 has several of the same or similar features of the FT handler 100. In view of these same or similar features between the FT handler 100 and the FT handler 200, these same or similar features between the FT handler 100 as shown in FIG. 1 and the FT handler 200 as shown in FIG. 2 will have the same or similar reference numerals. As the FT handler 200 as shown in FIG. 4 is similar to the FT handler 100 as shown in FIG. 1, and for the sake of brevity and simplicity of the present disclosure, the following discussion will focus on additional or different features of the FT handler 200 as shown in FIG. 4 relative to the FT handler 100 as shown in FIG. 1.

Similar to the FT handler 100, the FT handler 200 includes the end effector 104, the first TIM layer 112, the heater pad 114, and the second TIM layer 116. As discussed earlier herein with respect to the FT handler 100 as shown in FIG. 1, the first TIM layer 112 is stacked on the second side 108 of the end effector 104, the heater pad 114 is on the first TIM layer 112, and the second TIM layer 116 is on the heater pad 114. However, unlike the FT handler 100 as shown in FIG. 1, the fin structure 202 is stacked on and coupled to the second TIM layer 116 instead of the fin structure 102 of the FT handler 100 as shown in FIG. 1. The fin structure 202 is present in the FT handler 200 instead of the fin structure 102 to reduce the likelihood of or prevent formation or propagation of the one or more air gaps 144 as discussed earlier herein due to the first surface 118 of the fin structure 102 being substantially flat or level.

Unlike the fin structure 102 as shown in FIG. 1, the fin structure 202 has a first surface 204 and a second surface 206 opposite to the first surface 204, and one or more recesses 207 extend into the second surface 206 of the fin structure 202 and terminate within the fin structure 202 before reaching the second surface 206 of the fin structure 202. A plurality of pillars 208 of the fin structure 202 extends outward from the second surface 206 into the chamber 128. In the FT handler 100, the chamber 128 is delimited and defined by the lateral wall structure 126a of the container 126, the cover structure 126b of the container 126, and the fin structure 202.

As shown in the embodiment of the fin structure 202 as shown in FIG. 4, the one or more recesses 207 extend into the second surface 206 of the fin structure 202 and define or delimit one or more protrusions 210. In the embodiment of the fin structure 202 as shown in FIG. 4, the one or more recesses 207 is a plurality of recesses 207 and the one or more protrusions 210 are a plurality of protrusions 210. However, in some alternative embodiments of the fin structure 202, the one or more recesses 207 may only include a single recess 207 and may only include a single protrusion 210.

In the embodiment of the fin structure as shown in FIG. 4, the one or more protrusions 210 have a pointed shape. However, in some alternative embodiments of the fin structure 202, the one or more protrusions 210 may have a blunted end, may have a flat end, or may have some other size and shape.

As shown in FIG. 4, the one or more recesses 207 are filled with the second TIM layer 116 and the one or more protrusions 210 extend into the second TIM layer 116. The one or more protrusions 210 are enclosed and surrounded by the second TIM layer 116. Pointed ends 212 of the one or more protrusions 210 are within the second TIM layer 116. The pointed ends 212 of the one or more protrusions 210 are spaced apart from the heater pad 114. In other words, in the embodiment of the FT handler 200 as shown in FIG. 4, the pointed ends 212 of the one or more protrusions 210 do not reach the heater pad 114.

Similar to the recess 122 in the fin structure 102 that receives the seal structure 123 (e.g., an O-ring) of the FT handler 100 as shown in FIG. 1, the fin structure 202 of the FT handler 200 as shown in FIG. 4 includes a recess 214 that receives the first seal structure or component 124. The recess 214 extends into the second surface 206 of the fin structure 202 and terminates within the fin structure 202 before reaching the first surface 204 of the fin structure 202.

Similar to the lateral wall structure 126a being stacked on and coupled to the second surface 120 of the fin structure 102 of the FT handler 100 as shown in FIG. 1, the fin structure 202 of the FT handler 200 as shown in FIG. 4 includes the lateral wall structure 126a being stacked on and coupled to the second surface 206 of the fin structure 202. The lateral wall structure 126a overlaps the recess 214 and the sealing structure 124 within the recess 214. The sealing structure 124 seals the lower end of the chamber 128. The chamber 128 is delimited by the lateral wall structure 126a of the container 126, the cover structure 126b of the container 126, and the second surface 206 of the fin structure 202. The plurality of pillars 208 of the fin structure 202 extends into the chamber 128, and, similar to the plurality of pillars 124 of the fin structure 102 of the FT handler 100 as shown in FIG. 1, the plurality of pillars 208 of the fin structure 202 of the FT handler 200 as shown in FIG. 4 is present to dissipate heat from the FT handler 100 to control a temperature of the FT handler 100 when in use.

As discussed earlier herein, the one or more gaps 144 are formed when forming the FT handler 100 by stacking or coupling the fin structure 102 to the second TIM layer 116 or are formed or propagate when the FT handler 100 increases or decreases in temperature. However, unlike the FT handler 100 including the fin structure 102 that results in the one or more air gaps 144, the FT handler 200 includes the fin structure 202 further reducing the likelihood of or preventing formation or propagation of the one or more air gaps 144 at an interface between the second TIM layer 116 and the fin structure 202. The one or more air gaps 144 have a reduced likelihood of occurring or are completely prevented from occurring due to the presence of the one or more recesses 207 that extend into the second surface 204 of the fin structure 202.

The presence of the recesses 207 in the fin structure 202 reduces or prevents the formation of the one or more air gaps 144 when the fin structure 202 is stacked on and coupled to the second TIM layer 116 when forming the FT handler 200. For example, once the fin structure 202 is stacked on the second TIM layer 116, any air that is present between the interface of the fin structure 202 and the second TIM layer is pushed out by applying pressure to the fin structure 202. Applying this pressure to the fin structure 202 results in the second TIM layer completely filling the recesses 207 and pushing out any air that was previously present between the fin structure 202 and the second TIM layer.

The presence of the recesses 207 reduces or prevents the formation or propagation of the one or more air gaps 144 when the FT handler 200 is being utilized to perform a test on one or more semiconductor devices (e.g., semiconductor dice, semiconductor packages, or some other similar or like type of semiconductor device). For example, when the end effector 104 is holding onto a single semiconductor package (not shown) and the single semiconductor package is being tested by performing an HPC test on the semiconductor package, thermal energy that is exposed to the FT handler 200 is more readily dissipated due to the presence of the one or more protrusions 210 within the second TIM layer due to an increase in contact area between the fin structure 202 and the second TIM layer 116. This greater efficiency in dissipating thermal energy due to the presence of the one or more protrusions 210 of the fin structure 202 reduces the likelihood of or prevents the one or more air gaps 144 being formed or propagating at the interface between the fin structure 202 and the second TIM layer 116.

The presence of the recesses 207 reduces or prevents the formation or propagation of the one or more air gaps 144 when the FT handler 200 is being utilized to perform a test on one or more semiconductor devices (e.g., semiconductor dice, semiconductor packages, or some other similar or like type of semiconductor device). For example, when the end effector 104 is holding onto a single semiconductor package (not shown) and the single semiconductor package is being tested by performing an HPC test on the semiconductor package, thermal energy that is exposed to the FT handler 200 is more readily dissipated due to the presence of the one or more protrusions 210 within the second TIM layer due to an increase in contact area between the fin structure 202 and the second TIM layer 116. This greater efficiency in dissipating thermal energy due to the presence of the one or more protrusions 210 of the fin structure 202 reduces the likelihood of or prevents the one or more air gaps 144 being formed or propagating at the interface between the fin structure 202 and the second TIM layer 116.

Figure 5A:
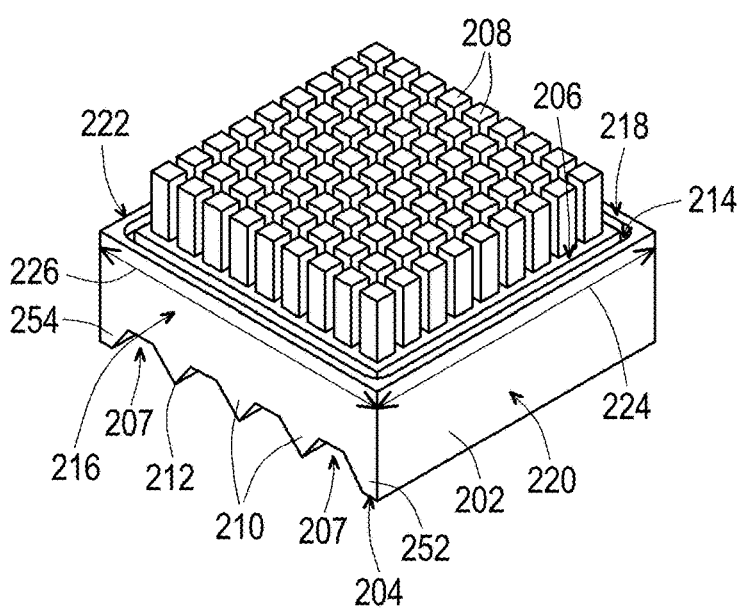
FIG. 5A is a perspective view of a fin structure that can be utilized within the FT handler as shown in FIG. 4, in accordance with some embodiments.
Figure 5B:
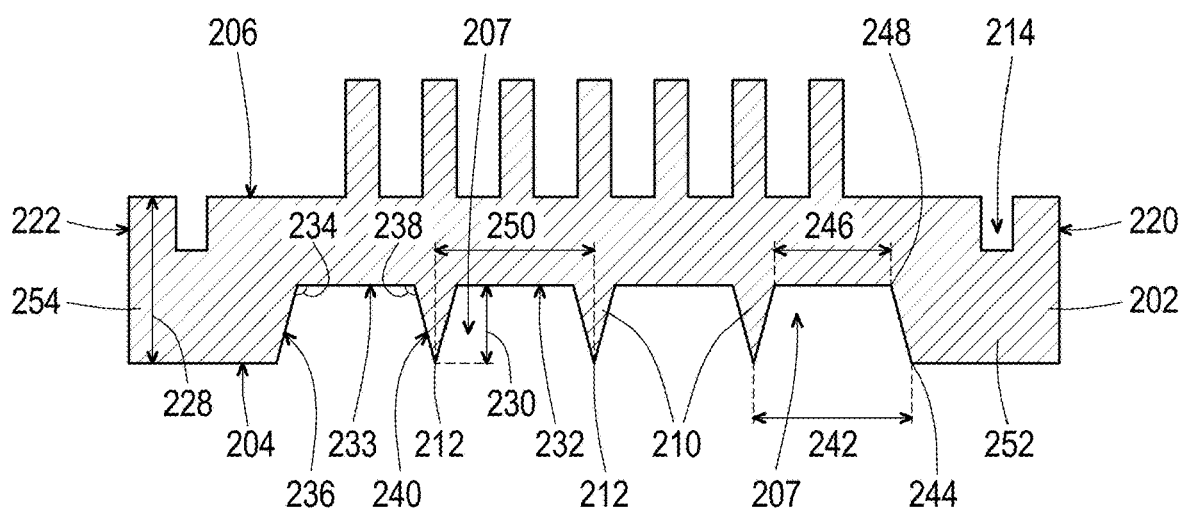
FIG. 5B is a cross-sectional side view of the fin structure as shown in FIG. 5A that can be utilized within the FT handler as shown in FIG. 4, in accordance with some embodiments.
Figure 5C:
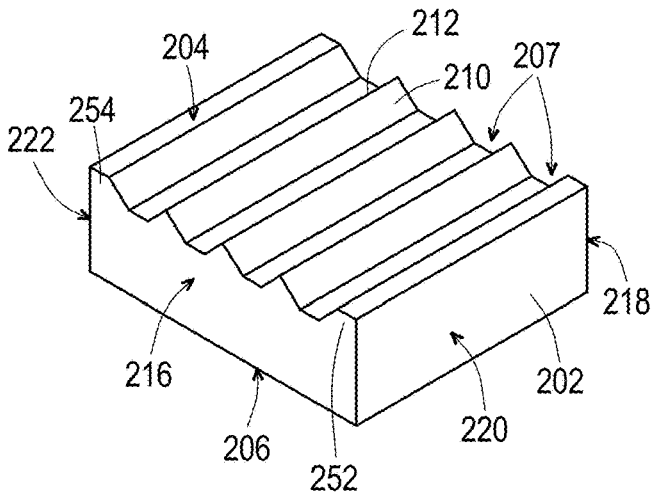
FIG. 5C is a perspective view of the fin structure as shown in FIGS. 5A and 5B that can be utilized within the FT handler as shown in FIG. 4, in accordance with some embodiments.

FIG. 5A is a perspective view of the fin structure 202 as present within the FT handler 200 as shown in FIG. 4. FIG. 5B is a cross-sectional side view of a first side of the fin structure 202. FIG. 5C is a perspective view of a second side of the fin structure 202 opposite to the first side of the fin structure 202 as shown in FIG. 5A.

As shown in FIG. 5A, the recess 214 extends fully around the plurality of pillars 208. In this embodiment of the fin structure 202, the one or more protrusions 210 extend fully from a first sidewall 216 of the fin structure 202 to a second sidewall 218 of the fin structure 202. In this embodiment of the fin structure 202, the one or more protrusions 210 are parallel with a third sidewall 220 and a fourth sidewall 222 that is opposite to the third sidewall 220. The third sidewall 220 and the fourth sidewall 222 are transverse to the first sidewall 216 and the second sidewall 218, and the third sidewall 220 and the fourth sidewall 222 extend from the first sidewall 216 to the second sidewall 218. In this embodiment of the fin structure 202, the one or more recesses 207 extend from the first sidewall 216 to the second sidewall 218.

As shown in FIG. 5B, a first dimension 224 extends from the first sidewall 216 to the second sidewall 218. In this embodiment as shown in FIG. 5 of the fin structure 202, the one or more protrusions 210 have the first dimension as the one or more protrusions 210 extend from the first sidewall 216 to the second sidewall 218, and the one or more recesses 207 have the first dimension as the one or more recesses 207 extend from the first sidewall 216 to the second sidewall 218.

As shown in FIG. 5A, a second dimension 226 extends from the third sidewall 220 to the fourth sidewall 222. In this embodiment as shown in FIG. 5A, the second dimension 226 is equal to the first dimension 224 such that the fin structure 202 has a square-like profile when viewed onward from the first or second surfaces 204, 206 of the fin structure 202. However, in some alternative embodiments of the fin structure 202, the second dimension 226 is less than or greater than the first dimension 224 such that the these alternative embodiments of the fin structure 202 have a rectangular-like profile when viewed onward from the first or second surfaces 204, 206 of the fin structure 202. In at least one embodiment of the fin structure 202, the first dimension 224 is less than or equal to 45 mm (millimeters). In at least one embodiment of the fin structure 202, the second dimension 226 is less than or equal to 45 mm (millimeters).

As shown in FIG. 5B, a third dimension 228 extends from the first surface 204 to the second surface 206. A fourth dimension 230 extends from a third surface 232 to the pointed end 212 of a respective protrusion of the one or more protrusions 210 that delimits a respective recess 207 of the one or more recesses 207. The third surface 232 delimits and defines the respective recess 207. The fourth dimension 230 may be referred to as a depth of the one or more recesses 207. The third dimension 228 is greater than the fourth dimension 230. The fourth dimension 230 is less than or equal to 2 mm (millimeters).

As shown in FIG. 5B, a first angle 234 is between a fourth surface 233 and a first angled surface 236. In other words, the first angled surface 236 is at the first angle 234 relative to the fourth surface 233. The first angle 234 is greater than or equal to 120 degrees or is less than or equal to 160 degrees. The fourth surface 233 is another surface that delimits a respective recess of the one or more recesses 207 (e.g., based on the orientation as shown in FIG. 5B, the left-most recess of the one or more recesses 207).

As shown in FIG. 5B, a second angle 238 is between the fourth surface 233 and a second angled surface 240. In other words, the second angled surface 240 is at the second angle 238 relative to the fourth surface 233. The second angled surface is a respective surface of a respective protrusion of the one or more protrusions 210 that defines the left-most recess of the one or more recesses 207 based on the orientation as shown in FIG. 5B. The second angle 238 is greater than or equal to 120 degrees or is less than or equal to 160 degrees.

As shown in FIG. 5B, a fifth dimension 242 extends from a first point 244 to the right-most pointed end 212 of the left-most respective protrusion of the one or more protrusions 210 as shown in FIG. 5A. A sixth dimension 246 extends from a second point 248 to the left-most respective protrusion of the one or more protrusions 210. The sixth dimension 246 is less than the fifth dimension 242. The sixth dimension 246 is a width of a respective third surface 232 that delimits the left-most recess 207 of the one or more recesses 207 as shown in FIG. 5A.

As shown in FIG. 5B, a seventh dimension 250 extends between a pair of pointed ends 212 of a pair of the one or more protrusions 210 that are adjacent to each other. The seventh dimension 250 may be greater than or equal to the fifth dimension 242. The seventh dimension 250 may be referred to as a pitch between pairs of pointed ends 212 of adjacent pairs of the one or more protrusions 210.

As shown in FIG. 5B, the one or more recesses 207 have a trapezoidal profile, and the one or more protrusions 210 have a triangular prism profile. However, in some alternative embodiments of the fin structure 202, various dimensions may be selected such that the one or more protrusions 210 have a different shape resulting in the one or more recesses 207 having a shape corresponding to these differently shaped embodiments of the one or more protrusions 210.

As shown in FIG. 5C, the one or more recesses 207 extend from the first sidewall 216 to the second sidewall 218. As shown in FIG. 5B, the one or more protrusions 210 extend from the first sidewall 216 to the second sidewall 218.

As shown in FIGS. 4, 5A, 5B, and 5C, the one or more protrusions 210 are between a first peripheral portion 252 at the third sidewall 220 and a second peripheral portion 254 at the fourth sidewall 222. The first peripheral portion 252 is opposite to the second peripheral portion 254, and the first and second peripheral portions 252, 254 are separated from each other by a central portion of the fin structure 202 between the first and second peripheral portions 252, 254. The one or more protrusions 210 are present along the central portion of the fin structure 202.

Figure 6:
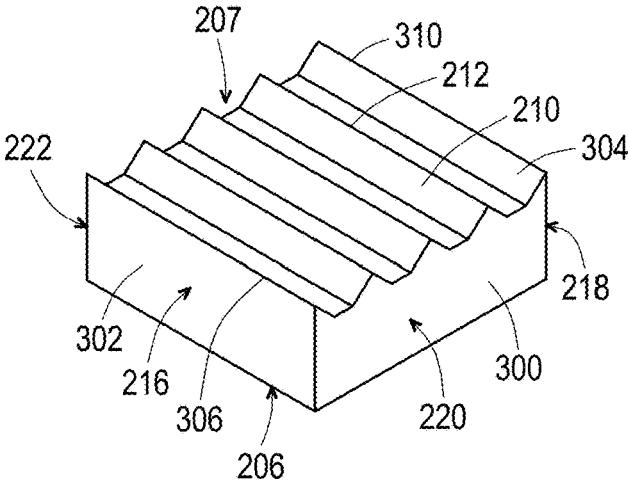
FIG. 6 is a perspective view of a fin structure that can be utilized within the FT handler as shown in FIG. 4, in accordance with some embodiments.

FIG. 6 is a perspective view of a fin structure 300, in accordance with some embodiments. The fin structure 300 has several of the same or similar features as the fin structure 202, and, therefore, the same or similar features in the fin structure 300 relative to the fin structure 202 have been provided with the same or similar reference numerals. The following discussion of the fin structure 300 will focus on features of the fin structure 300 different from the fin structure 202. For the sake of simplicity and brevity of the present disclosure, details of these features that are the same or similar between the fin structure 300 and the fin structure 202 may not be reproduced as follows.

Unlike the fin structure 202 in which the one or more recesses 207 and the one or more protrusions 210 extend from the first sidewall 216 to the second sidewall 218, the one or more recesses 207 and the one or more protrusions 210 extend from the third sidewall 220 to the fourth sidewall 222. In other words, the one or more recesses 207 and the one or more protrusions 210 of the fin structure 300 are oriented perpendicular or transverse relative to the one or more recesses 207 and the one or more protrusions 210 in the fin structure 202.

Unlike the fin structure 202 that includes the first peripheral portion 252 and the second peripheral portion 254, the fin structure 300 does not include a structure or portion similar to the first peripheral portion 252 and the second peripheral portion 254. However, in some alternative embodiments of the fin structure 300, the first peripheral portion 252 may be present at the first sidewall 216 and the second peripheral portion 254 may be present at the second sidewall 218.

The fin structure 300 further includes a first edge portion 302 at the first sidewall 216 and a second edge portion 304 at the second sidewall 218. The first edge portion 302 includes a first pointed end 306 and the second edge portion 304 has a second pointed end 308. The first edge portion 302 extends from the third sidewall 220 to the fourth sidewall 222, and the second edge portion 304 extends from the third sidewall 220 to the fourth sidewall 222. In this embodiment of the fin structure 300, the first edge portion 302 and the second edge portion 304 are half-profiles or partial-profiles of the one or more protrusions 210.

As the one or more protrusions 210, the one or more recesses 207, and the first and second edge portions 302, 304 extend from the third sidewall 220 to the fourth sidewall 222, the one or more protrusions 210, the one or more recesses 207, and the first and second edge portions 302, 304 have the second dimension 226.

Figure 7:
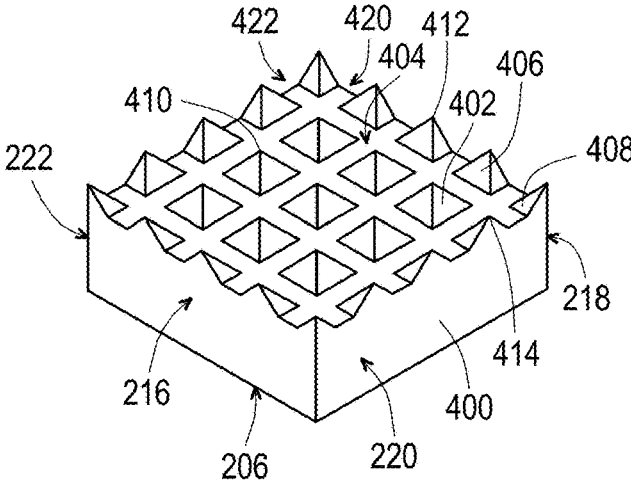
FIG. 7 is a perspective view of a fin structure that can be utilized within the FT handler as shown in FIG. 4, in accordance with some embodiments.

FIG. 7 is a perspective view of a fin structure 400 that can be utilized within the FT handler as shown in FIG. 4, in accordance with some embodiments. The fin structure 400 has several of the same or similar features as the fin structures 202, 300, and, therefore, the same or similar features in the fin structure 400 relative to the fin structures 202, 300 have been provided with the same or similar reference numerals. The following discussion of the fin structure 400 will focus on features of the fin structure 400 different from the fin structures 202, 300. For the sake of simplicity and brevity of the present disclosure, details of these features that are the same or similar between the fin structure 400 and the fin structures 202, 300 may not be reproduced as follows.

Unlike the fin structures 202, 300 that include the one or more protrusions 210, the fin structure 400 includes one or more first protrusions 402 that extend outward from a surface 404 of the fin structure 400 opposite to the second surface 206 of the fin structure 400. The fin structure 400 further includes one or more second protrusions 406 that are at and along the first sidewall 216, the second sidewall 218, the third sidewall 220, and the fourth sidewall 222. The fin structure 400 further includes one or more third protrusions 408 at respective corners at the first sidewall 216, the second sidewall 218, the third sidewall 220, and the fourth sidewall 222. The one or more first protrusions 402 have a pyramidal prism profile, the one or more second protrusions 406 have a semi-pyramidal prism profile or a partial pyramidal prism, and the one or more third protrusions 408 have a semi-pyramidal profile or a partial pyramidal prism. The one or more first protrusions 402 have first pointed ends 410, the one or more second protrusions 406 have second pointed ends 412, and the one or more third protrusions 408 have third pointed ends 414.

As shown in FIG. 7, the one or more first protrusions 402 each have a pyramidal prism profile, the one or more second protrusions 406 each have a half-pyramidal prism profile, and the one or more third protrusions 408 have a quarter-pyramidal prism profile. In other words, the one or more second protrusions 406 are half the size as the one or more first protrusions 402, and the one or more third protrusions 408 are half the size of the one or more second protrusions 406 and a quarter of the size of the one or more first protrusions 402. The one or more second protrusions 406 and the one or more third protrusions 408 may be referred to as truncated pyramidal profiles.

The one or more first, second, and third protrusions 402, 406, 408 are delimited and defined by one or more first recesses 420 and are delimited and defined by one or more second recesses 422. The one or more first recesses 420 extend from the first sidewall 216 to the second sidewall 218, and the one or more second recesses 422 extend from the third sidewall 220 to the fourth sidewall 222. The one or more first recesses 420 have the second dimension 226, and the one or more second recesses 422 have the first dimension 224. The one or more first protrusions 402, the one or more second protrusions 406, and the one or more third protrusions 408 are arranged in an array pattern along the surface 404 of the fin structure 400.

Figure 8:
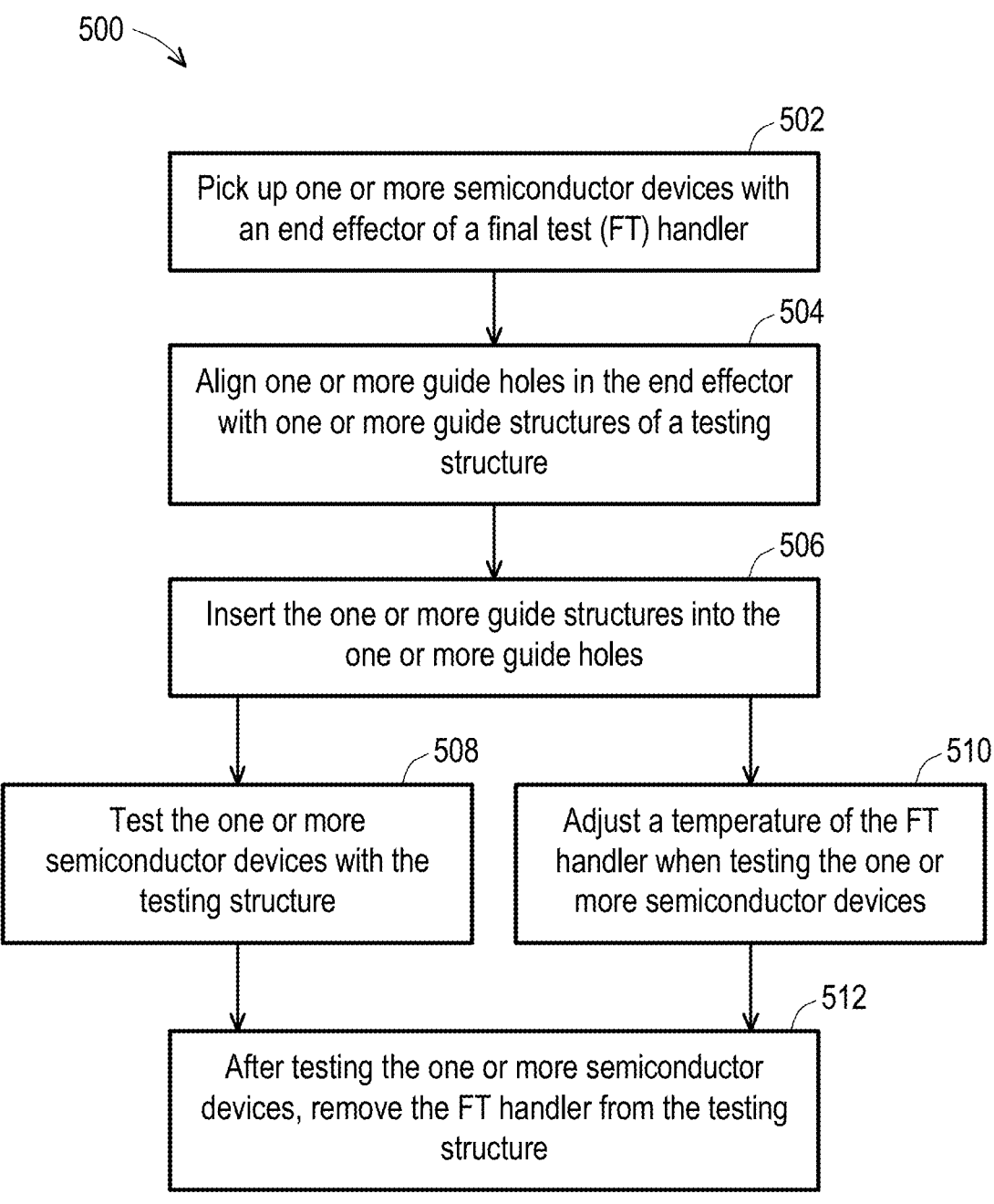
FIG. 8 is a flowchart of a method of testing one or more semiconductor dice or packages utilizing the FT handler as shown in FIG. 4, in accordance with some embodiments.

FIG. 8 is a flowchart 500 of a method of testing one or more semiconductor dice, packages, or devices 514 utilizing the FT handler as shown in FIG. 4, in accordance with some embodiments. The flowchart 500 of the method of testing includes a first step 502, a second step 504, a third step 506, a fourth step 508, a fifth step 510, and a sixth step 512.

In the first step 502 of the flowchart 500 of the method of testing one or more semiconductor devices 514 (see FIG. 9), the end effector 104 of the FT handler 200 picks up the one or more semiconductor devices. In this embodiment of the FT handler 200, the end effector 104 is shown as picking up one semiconductor device 514 as shown in FIG. 9. In some alternative embodiments of the FT handler 200, the end effector 104 of the FT handler 200 may be configured to and structured to pick up a plurality of the semiconductor devices 514 that are all to be tested at the same time. However, for the following discussion, the respective steps of the flowchart 500 will be discussed with the one semiconductor device 514 being picked up and tested utilizing the FT handler 200. For example, in the first step 502, when the end effector 104 is a vacuum end effector, the end effector 104 is brought into close proximity to the semiconductor device 514 and is then activated generating a vacuum resulting in the semiconductor device 514 being picked up and held onto by the end effector 104 at a respective surface of the first portion 104a of the end effector 104.

After the first step 502 of the flowchart 500 in which the semiconductor device 514 is picked up and held onto by the end effector 104, in a second step 504 the FT handler 200 is moved to transport the semiconductor device 514 to a testing structure 516. The FT handler 200 is aligned with the testing structure such that the one or more guide holes 110 are each aligned with a respective guide structure or pin of one or more guide structures or pins 518 of a socket base or structure 520 of the testing structure 516. The one or more guide holes 110 are configured to, in operation, receive the one or more guide structures 518 of the socket structure 520 of the testing structure 516.

After the second step 504 in which the one or more guide holes 110 are aligned with the one or more guide structures 518, in a third step 506 the FT handler 200 is moved in a downward direction as represented by an arrow 521 as shown in FIG. 9. As the FT handler 200 is moved in the downward direction, the one or more guide structures 518 are inserted into and received by the one or more guide holes 110. As the FT handler 200 is moved in the downward direction, the semiconductor device 514 is inserted into a testing cavity 517 of the testing structure 516. The one or more guide structures 518 being inserted and received by the one or more guide holes 110 results in one or more conductive structures or contacts 522 of the semiconductor device 514 abutting one or more contact structures 524 of the testing structure 516. The one or more contact structures 524 may be referred to as conductive testing structures. The one or more contact structures 524 extend through a first portion 526 and are coupled to a load board 528 of the testing structure 516. The first portion 526 may be a non-conductive portion. While not shown, the load board 528 includes one or more electrical connections (i.e., conductive vias, conductive traces, or some other similar or like type of conductive structure) that are in electrical communication with a tester component 530. The one or more electrical connections provide electrical pathways from the tester component 530 to the one or more contact structures 524.

After the third step 506 in which the one or more conductive structures 522 are brought into contact with the one or more contact structures 524, in a fourth step 508 the tester component 530 outputs one or more electrical signals to the one or more contact structures 524 through the one or more electrical connections within the load board 528 when, for example, performing an HPC test on the semiconductor device 514 for quality assurance purposes. The semiconductor device 514 receives these one or more electrical signals through the one or more conductive structures 522, which may be solder balls. As a result of the one or more electrical signals received by the semiconductor device 514, the semiconductor device outputs one or more response electrical signals back to the test component 530 through the one or more conductive structures 522, the one or more contact structures 524, and the one or more electrical connections within the load board 528. The tester component 530 receives the one or more response electrical signals output by the semiconductor device as a result of the electrical signal sent from the tester component 530 to the semiconductor device 514. While not shown, the test component 530 may be in electrical communication with a processor or microprocessor to take the one or more response electrical signals received from the semiconductor device 514 such that the processor or microprocessor may analyze the one or more response electrical signals received from the semiconductor device 514 to determine whether the semiconductor device 514 is functioning within selected tolerances for quality assurance purposes.

In tandem with the fourth step 508 in which the semiconductor device 514 is being tested, in a fifth step 510 a temperature of the FT handler 200 is being controlled by controlling the heater pad 114 and a flow of coolant into and through the chamber 128. When activated, the heater pad 114 provides heat to the FT handler 200 increasing the temperature of the FT handler 200. When the inlet structure 132 is opened, coolant is introduced through the inlet structure 132 into the chamber 128 dissipating thermal energy within the FT handler 200 resulting in the temperature of the FT handler 200 decreasing. When the outlet structure 138 is opened, coolant exits the chamber 128. The coolant flows into and out of the chamber 128 to dissipate thermal energy within the FT handler 200 to decrease the temperature of the FT handler. In view of this discussion, the coolant is introduced into and removed from the chamber 128 and the heater pad 114 is turned on and off to control the temperature of the FT handler 200. When the thermal energy is being dissipated from the FT handler 200, the one or more protrusions 210 and the one or more recesses 207 of the fin structure 202 result in a larger contact area with the second TIM layer 116 resulting in greater control of the heat dissipation and greater control of the temperature of the FT handler 200 relative to the FT handler 100 that instead includes the fin structure 102, which does not include the one or more protrusions 210 and the one or more recesses 207.

It will be readily appreciated that the heater pad 114 and the coolant introduction and removal in the fifth step 510 may occur at any time during the method of testing as illustrated by the flowchart 500. In other words, the heater pad 114 and the introduction of coolant and removal of coolant may occur during any of the respective steps 502, 504, 508, 510, 512 to control the temperature of the FT handler 200. By controlling the temperature of the FT handler 200 during the respective steps 502, 504, 506, 508, 510, 512 within the flowchart 500, the likelihood of mechanical defects (e.g., cracking, warpage, etc.) occurring within the semiconductor device 514 being tested utilizing the FT handler is reduced or prevented. Reducing the likelihood of or preventing mechanical defects (e.g., cracking, warpage, etc.) of the semiconductor device 514 when being tested, results in increasing a yield number of a semiconductor manufacturing plant (FAB) increasing profit and reducing waste.

After the fourth and fifth steps 508, 510 in which the semiconductor device 514 is tested and the temperature of the FT handler 200 is controlled by the heater pad 114 and the introduction and removal of coolant into and out of the chamber 128, in a sixth step 512 the FT handler 200 moves in an upward direction opposite to the downward direction represented by the arrows 521 as shown in FIG. 9. As the FT handler 200 moves upward, the semiconductor device 514 is removed from the testing cavity 517 and the one or more guide structures 518 are removed from the one or more guide holes 110. The FT handler 200 then moves away from the testing structure 516 and may transport and drop the semiconductor device 514 at another respective location within the semiconductor manufacturing plant (FAB).

In view of the above discussion, providing the fin structure 202 with the one or more protrusions 210 and the one or more recesses 207 prevents the formation or propagation of the air gaps or cavities 144 as shown in FIG. 3. This improves the overall efficiency and accuracy of controlling the temperature of the FT handler 200 reducing the likelihood of or preventing mechanical defects from forming or propagating within the FT handler 200 or within the semiconductor device 514 being tested utilizing the FT handler 200.

At least one embodiment of a device of the present disclosure may be summarized as including: an end effector structure including a first side and a second side opposite to the first side, the first side is configured to, in operation, engage with a semiconductor package to be tested; a first thermal interface material coupled to the second side of the end effector structure; a heater pad coupled to the first thermal interface material; a second thermal interface material coupled to the heater pad; and a fin structure coupled to the second thermal interface material, the fin structure including: a third side that is coupled to the second thermal interface material; a fourth side opposite to the third side and facing away from the second thermal interface material; a plurality of fins at the third side and protruding from the third side into the second thermal interface material; a plurality of recesses at the third side, the plurality of recesses are at least partially delimited by the plurality of fins, the plurality of recesses being filled with the second thermal interface material; and a plurality of pillars at the fourth side and protruding from the fourth side.

At least one embodiment of a system of the present disclosure may be summarized as including: a semiconductor package handler including: an end effector structure including a first side and a second side opposite to the first side, the end effector structure includes a first guide structure, and the first side of the end effector structure is configured to, in operation, engage with a semiconductor package to be tested; a first thermal interface material coupled to the second side of the end effector structure; a heater pad coupled to the first thermal interface material; a second thermal interface material coupled to the heater pad; and a fin structure coupled to the second thermal interface material, the fin structure including: a third side that is coupled to the second thermal interface material; a fourth side opposite to the third side and facing away from the second thermal interface material; a plurality of fins at the third side and protruding from the third side into the second thermal interface material; a plurality of recesses at the third side, the plurality of recesses are at partially delimited by the plurality of fins, the plurality of recesses being filled with the second thermal interface material; and a plurality of pillars at the fourth side and protruding from the fourth side; and a testing structure including: a socket base including a second guide structure, the second guide structure is configured to, in operation, engage with the first guide structure of the end effector structure; and one or more conductive testing structures configured to, in operation, be in electrical communication with one or more conductive structures of the semiconductor package, and the one or more conductive testing structures are configured to, in operation, provide an electrical pathway to the one or more conductive structures of the semiconductor package to test electrical structures and connections of the semiconductor package.

At least one embodiment of a fin structure configured to be utilized within a semiconductor package handler of the present disclosure may be summarized as including: a first side; a second side opposite to the first side; a plurality of fins at the first side and protruding from the first side, the plurality of fins are configured to be inserted into a thermal interface material; a plurality of recesses at the first side, the plurality of recesses are at least partially delimited by the plurality of fins, and the plurality of recesses are filled with the thermal interface material; and a plurality of pillars at the second side and protruding from the second side, the plurality of pillars being configured to be exposed to a coolant to dissipate heat from the plurality of pillars.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
an end effector structure including a first side and a second side opposite to the first side, the first side is configured to, in operation, engage with a semiconductor package to be tested;
a first thermal interface material coupled to the second side of the end effector structure;
a heater pad coupled to the first thermal interface material;
a second thermal interface material coupled to the heater pad; and
a fin structure coupled to the second thermal interface material, the fin structure including:
  a third side that is coupled to the second thermal interface material;
  a fourth side opposite to the third side and facing away from the second thermal interface material;
  a plurality of fins at the third side and protruding from the third side into the second thermal interface material;
  a plurality of recesses at the third side, the plurality of recesses are at least partially delimited by the plurality of fins, the plurality of recesses being filled with the second thermal interface material; and
  a plurality of pillars at the fourth side and protruding from the fourth side.

2. The device of claim 1, further comprising a coolant housing coupled to the fourth side of the fin structure.

3. The device of claim 2, wherein:
the coolant housing further includes:
  a housing portion coupled to the fourth side of the fin structure; and
  a cover coupled to the housing portion,
  wherein the housing portion of the coolant housing, the cover of the coolant housing, and the fourth side of the fin structure define a coolant chamber.

4. The device of claim 3, wherein the plurality of pillars of the fin structure extends into the coolant chamber.

5. The device of claim 4, wherein:
the cover includes a coolant inlet configured to allow introduction of a coolant into the coolant chamber; and
the housing portion includes a coolant outlet configured to allow removal of the coolant from the coolant chamber.

6. The device of claim 3, further comprising:
a first O-ring within a first O-ring recess extending into the fin structure and at the fourth side of the fin structure, the first O-ring seals a first interface between the fourth side of the fin structure and the housing portion; and
a second O-Ring within a second O-ring recess extending into the housing portion, the second O-ring seals a second interface between the housing portion and the cover.

7. The device of claim 6, wherein the first O-ring and the second O-ring seal the coolant chamber preventing coolant from escaping from the coolant chamber at the first interface and second interface, respectively.

8. The device of claim 1, wherein the end effector structure further includes one or more guide holes that extend through the end effector structure, the one or more guide holes are configured to, in operation, receive one or more guide pins of a testing structure.

9. The device of claim 1, wherein the end effector structure further includes a vacuum end effector structure configured to, in operation, engage with the semiconductor package by vacuuming onto the semiconductor package.

10. A system, comprising:
a semiconductor package handler including:
an end effector structure including a first side and a second side opposite to the first side, the end effector structure includes a first guide structure, and the first side of the end effector structure is configured to, in operation, engage with a semiconductor package to be tested;
a first thermal interface material coupled to the second side of the end effector structure;
a heater pad coupled to the first thermal interface material;
a second thermal interface material coupled to the heater pad; and
a fin structure coupled to the second thermal interface material, the fin structure including:
  a third side that is coupled to the second thermal interface material;
  a fourth side opposite to the third side and facing away from the second thermal interface material;
  a plurality of fins at the third side and protruding from the third side into the second thermal interface material;
  a plurality of recesses at the third side, the plurality of recesses are at partially delimited by the plurality of fins, the plurality of recesses being filled with the second thermal interface material; and
  a plurality of pillars at the fourth side and protruding from the fourth side; and
a testing structure including:
  a socket base including a second guide structure, the second guide structure is configured to, in operation, engage with the first guide structure of the end effector structure; and
  one or more conductive testing structures configured to, in operation, be in electrical communication with one or more conductive structures of the semiconductor package, and the one or more conductive testing structures are configured to, in operation, provide an electrical pathway to the one or more conductive structures of the semiconductor package to test electrical structures and connections of the semiconductor package.

11. The system of claim 10, wherein:
the fin structure further includes:
  a first sidewall that is transverse to the third side and the fourth side and extends from the third side to the fourth side;
  a second sidewall that is transverse to the third side and the fourth side, extends from the third side to the fourth side, and is opposite to the first sidewall,
  wherein each respective fin of the plurality of fins extends from the first sidewall to the second sidewall.

12. The system of claim 10, wherein respective first fins of the plurality of fins are arranged in an array and have a pyramidal shape.

13. The system of claim 12, wherein respective second fins of the plurality of fins are spaced outward from the respective first fins of the plurality of first fins and have a truncated pyramidal shape.

14. The system of claim 10, wherein the plurality of pillars are arranged in an array along the fourth side of the fin structure.

15. The system of claim 10, wherein the first guide structure is one or more guide holes that extend through the end effector structure from the first side to the second side.

16. The system of claim 15, wherein the second guide structure is one or more guide pins that are configured to, in operation, be inserted into the one or more guide holes.

17. A fin structure configured to be utilized within a semiconductor package handler, comprising:

a first side;

a second side opposite to the first side;

a plurality of fins at the first side and protruding from the first side, the plurality of fins are configured to be inserted into a thermal interface material;

a plurality of recesses at the first side, the plurality of recesses are at least partially delimited by the plurality of fins, and the plurality of recesses are filled with the thermal interface material; and a plurality of pillars at the second side and protruding from the second side, the plurality of pillars being configured to be exposed to a coolant to dissipate heat from the plurality of pillars.

18. The fin structure of claim 17, further comprising:

a plurality of sidewalls including:

a first sidewall that is transverse to the first side and the second side and that extends from the first side to the second side; and a second sidewall that is transverse to the first side and the second side, that extends from the first side to the second side, and that is opposite to the first sidewall, and wherein each respective fin of the plurality of fins extends from the first sidewall to the second sidewall.

19. The fin structure of claim 17, further comprising:

a plurality of sidewalls including:

a first sidewall that is transverse to the first side and the second side and that extends from the first side to the second side; and a second sidewall that is transverse to the first side and the second side, that extends from the first side to the second side, and that is opposite to the first sidewall, and wherein:

respective first fins of the plurality of fins are arranged in an array, are between the first sidewall and the second sidewall, and have a pyramidal shape, and respective second fins of the plurality of fins are at and along a first location at which the first sidewall and the first side meet each other and a second location at which the second sidewall and the first side meet each other, and the respective second fins of the plurality of fins have a truncated pyramidal shape.

20. The fin structure of claim 17, wherein the plurality of pillars are arranged in an array along the second side.

* * * * *